(12) United States Patent
Yang et al.

(10) Patent No.: US 11,209,859 B2
(45) Date of Patent: Dec. 28, 2021

(54) ORGANIC LIGHT EMITTING DIODE DISPLAY PANEL HAVING DOUBLE RETAINING WALL STRUCTURE PROVIDED WITH AT LEAST A NOTCH REDUCING ITS BORDER WIDTH

(71) Applicant: Wuhan China Star Optoelectronics Semiconductor Display Technology Co., Ltd., Hubei (CN)

(72) Inventors: Jie Yang, Hubei (CN); Ming Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 301 days.

(21) Appl. No.: 16/464,005

(22) PCT Filed: Nov. 20, 2018

(86) PCT No.: PCT/CN2018/116529
§ 371 (c)(1),
(2) Date: May 24, 2019

(87) PCT Pub. No.: WO2020/082477
PCT Pub. Date: Apr. 30, 2020

(65) Prior Publication Data
US 2020/0409411 A1    Dec. 31, 2020

(30) Foreign Application Priority Data
Oct. 23, 2018 (CN) .......................... 201811238227.4

(51) Int. Cl.
*G06F 1/16* (2006.01)
*H01L 51/52* (2006.01)
*H01L 27/32* (2006.01)

(52) U.S. Cl.
CPC ........ *G06F 1/1609* (2013.01); *H01L 27/3244* (2013.01); *H01L 51/5237* (2013.01); *H01L 51/5246* (2013.01); *H01L 51/5253* (2013.01)

(58) Field of Classification Search
CPC ............. H01L 51/5237; H01L 51/5253; H01L 51/5246; H01L 27/3244; G06F 1/1609
See application file for complete search history.

(56) References Cited

U.S. PATENT DOCUMENTS 10,431,637 B2 * 10/2019 Jin ........................ H01L 27/323
10,847,752 B2 * 11/2020 Wang ................... H01L 51/5253
(Continued)

FOREIGN PATENT DOCUMENTS

| CN | 105914224 A | 8/2016 |
|----|-------------|--------|
| CN | 106711171 A | 5/2017 |

(Continued)

*Primary Examiner* — Ermias T Woldegeorgis
(74) *Attorney, Agent, or Firm* — Hamre, Schumann, Mueller & Larson, P.C.

(57) ABSTRACT

A narrow border organic light-emitting diode (OLED) display panel is provided, including a substrate, a light-emitting functional layer, a light-emitting functional layer having an organic sub-layer, an encapsulation layer, a first retaining wall, and a second retaining wall, wherein the first retaining wall is disposed around a circumferential periphery of the organic sub-layer; the second retaining wall is disposed between the first retaining wall and the organic sub-layer; wherein the second retaining wall is provided with at least a notch to reduce a border width of a side of the OLED display panel on which the notch is defined.

20 Claims, 5 Drawing Sheets

(56) References Cited

U.S. PATENT DOCUMENTS

| | | | |
|---|---|---|---|
| 2011/0069271 A1* | 3/2011 | Chu | ............... G02F 1/1339 |
| | | | 349/153 |
| 2018/0053810 A1* | 2/2018 | Jin | ............... G06F 3/04164 |
| 2018/0061728 A1 | 3/2018 | Chen | |
| 2018/0226454 A1 | 8/2018 | Liu et al. | |
| 2019/0280243 A1 | 9/2019 | Shin | |

FOREIGN PATENT DOCUMENTS

| | | |
|---|---|---|
| CN | 106775173 A | 5/2017 |
| CN | 107123744 A | 9/2017 |
| CN | 107768402 A | 3/2018 |
| CN | 107799665 A | 3/2018 |
| CN | 108598108 A | 9/2018 |

\* cited by examiner

ORGANIC LIGHT EMITTING DIODE DISPLAY PANEL HAVING DOUBLE RETAINING WALL STRUCTURE PROVIDED WITH AT LEAST A NOTCH REDUCING ITS BORDER WIDTH

FIELD OF INVENTION

The present application relates to a field of display technology and in particular, to a narrow border organic light-emitting diode (OLED) display panel.

BACKGROUND OF INVENTION

In an organic light-emitting diode (OLED) display panel, the panel may be composed of a display area and a non-display area.

A current package structure adopts an inorganic/organic/inorganic laminated structure. Because of the difference in inorganic and organic functions, a border of the inorganic layer is required to be larger than that of the organic layer, and borders of the organic and the inorganic layers are larger than the display area (active area, AA), as shown in FIG. 1, thereby, effectively limiting the border width of the organic layer, which can effectively reduce the border width of an entire panel.

Technical Problem

At present, a double retaining wall structure (an inner retaining wall and an outer retaining wall) is mostly used to define the circumference of an encapsulating organic layer to avoid the overflow of an organic material at the retaining wall. However, the structure of the double retaining wall increases the width of the border of the OLED display panel.

Technical Solution

To solve the above problem, the embodiments of the present application provide a narrow-border OLED display panel to solve the technical problem that the border width of the OLED display panel of the prior art is wide.

The embodiments of the present application provide a narrow border organic light-emitting diode (OLED) display panel, including:
a substrate; a light-emitting functional layer disposed on the substrate; an encapsulation layer disposed on the light-emitting functional layer and including an organic sub-layer; a first retaining wall for preventing an overflow of a material for forming the organic sub-layer when the organic sub-layer is formed, the first retaining wall is disposed around a circumferential periphery of the organic sub-layer; and a second retaining wall for preventing the overflow of the material for forming the organic sub-layer when the organic sub-layer is formed, the second retaining wall is disposed between the first retaining wall and the organic sub-layer; wherein the second retaining wall is provided with at least a notch to reduce a border width of a side of the OLED display panel on which the notch is defined; the second retaining wall includes two second side walls disposed on two sides of the organic sub-layer and a second sub-wall connected to two ends of the two second side walls, the notch is defined and formed between the other two ends of the second side walls; the first retaining wall includes a first sub-wall located close to the notch; the second side walls, the second sub-wall, and the first sub-wall are disposed around the circumferential periphery of the organic sub-layer; the second side walls each includes a flow guiding section located close to the notch for guiding the overflowed organic material to flow between the first retaining wall and the second retaining wall, and a plurality of flow guiding channels each having a capillary function is defined in the flow guiding section.

In the narrow border OLED display panel of the present application, wherein each of the flow guiding channels is a flow guiding groove, and a depth of the flow guiding groove is less than or equal to a height of the second side wall.

In the narrow border OLED display panel of the present application, wherein a depth of the flow guiding groove gradually becomes shallower from an end close to the notch toward an end away from the notch.

In the narrow border OLED display panel of the present application, wherein a spacing between two adjacent flow guiding grooves gradually increases from an end close to the notch toward an end away from the notch.

In the narrow border OLED display panel of the present application, wherein each of the flow guiding channels is a flow guiding hole.

In the narrow border OLED display panel of the present application, wherein the density of the flow guiding holes gradually decreases from an end close to the notch toward an end away from the notch.

In the narrow border OLED display panel of the present application, wherein the density of the flow guiding holes gradually increases from a top end of the second side wall to a bottom end of the second side wall.

In the narrow border OLED display panel of the present application, the flow guiding channels include flow guiding grooves and flow guiding holes, and a depth of each of the guiding grooves is less than or equal to a height of the second side walls.

The embodiment of the present application provides a narrow border OLED display panel, including:
a substrate; a light-emitting functional layer disposed on the substrate; an encapsulation layer disposed on the light-emitting functional layer and including an organic sub-layer; a first retaining wall for preventing an overflow of a material for forming the organic sub-layer when the organic sub-layer is formed, the first retaining wall being disposed around a circumferential periphery of the organic sub-layer and being closely connected; and a second retaining wall for preventing the overflow of the material for forming the organic sub-layer when the organic sub-layer is formed, the second retaining wall being disposed between the first retaining wall and the organic sub-layer; wherein the second retaining wall is provided with at least a notch to reduce a border width of a side of the OLED display panel on which the notch is defined.

In the narrow border OLED display panel of the present application, wherein the second retaining wall includes two second side walls disposed on two sides of the organic sub-layer and a second sub-wall connected to two ends of the two second side walls, the notch being defined and formed between the other two ends of the second side walls; the first retaining wall includes a first sub-wall located close to the notch; the second side walls, two of the second side walls and two of the first sub-walls are disposed around a peripheral side of the organic sub-layer.

In the narrow border OLED display panel of the present application, wherein the second side wall includes a flow guiding section located close to the notch for guiding the overflowed organic material to flow between the first retaining wall and the second retaining wall, and a plurality of flow guiding channels each having a capillary function being defined in the flow guiding section.

In the narrow border OLED display panel of the present application, the width of the flow guiding channel is less than 1 mm, and optionally, the width of the guiding channel is less than 100 micrometers.

In the narrow border OLED display panel of the present application, each of the flow guiding channels is a flow guiding groove, and a depth of the flow guiding groove is less than or equal to a height of the second side wall.

In the narrow border OLED display panel of the present application, wherein a depth of the flow guiding groove gradually becomes shallower from an end close to the notch toward an end away from the notch.

In the narrow border OLED display panel of the present application, wherein a spacing between two adjacent guiding channels gradually increases from an end close to the notch toward an end away from the notch.

In the narrow border OLED display panel of the present application, wherein each of the flow guiding channels is a flow guiding hole.

In the narrow border OLED display panel of the present application, wherein the density of the flow guiding holes gradually decreases from an end close to the notch toward an end away from the notch.

In the narrow border OLED display panel of the present application, wherein the density of the flow guiding holes gradually increases from a top end of the second side wall to a bottom end of the second side wall.

In the narrow border display panel of the present application, the flow guiding holes are arranged in an array, and the flow guiding holes between adjacent rows are arranged in a staggered manner.

In the narrow border OLED display panel of the present application, wherein the flow guiding channels include flow guiding grooves and flow guiding holes, and a depth of each of the guiding grooves is less than or equal to a height of the second side walls.

In the narrow border OLED display panel of the present application, wherein the flow guiding hole is located below the flow guiding groove and is provided staggered with the flow guiding groove, a depth of the flow guiding groove gradually becomes shallower from an end close to the notch toward an end away from the notch.

In the narrow border OLED display panel of the present application, a height of the first retaining wall is greater than a height of the second retaining wall.

Beneficial Effect

Compared to the prior art OLED display panel, the narrow border OLED display panel of the present application defines a notch on the second retaining wall, such that the site where the notch is defined has no wall, thereby saving the width of one wall, further reducing a border width of a side of the OLED display panel on which the notch is defined. The technical problem that the OLED display panel of the prior art has a wide border is resolved.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

Figure 1:
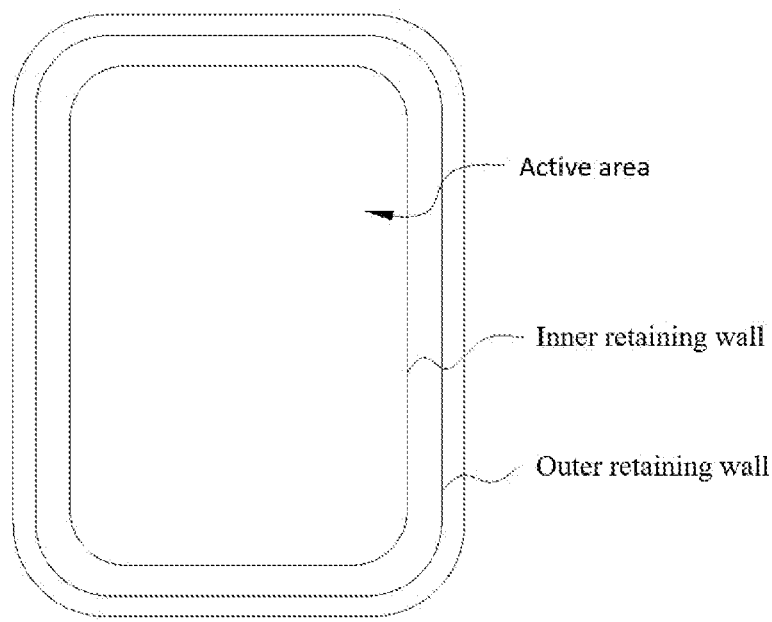
FIG. 1 is a schematic structural view of a prior-art organic light-emitting diode (OLED) display panel.

Please refer to the figures in the drawings, in which the same components are represented by the same reference numerals.

The following description is based on the embodiments of the present invention as illustrated, and should not be construed as limiting the embodiments that are not described herein.

It should be noted that the shape of a display area of an organic light-emitting diode (OLED) display panel of the present application may be any shape, such as a polygon, a circle, or a combination of a curved side and a straight side, and the like.

No matter what the shape of the display area of the OLED display panel it is, a first retaining wall and a second retaining wall are always disposed around a circumferential periphery of an organic sub-layer of an encapsulating layer, the shape of the first retaining wall and the second retaining wall may be the same or different from the display area of the OLED display panel. Therefore, the shape of the OLED display panel and the shapes of the first retaining wall and the second retaining wall are not limited herein.

In the present application, the OLED display panel is rectangular in shape, and the display area of the OLED display panel is a rectangle as an example but is not limited thereto.

Figure 2:
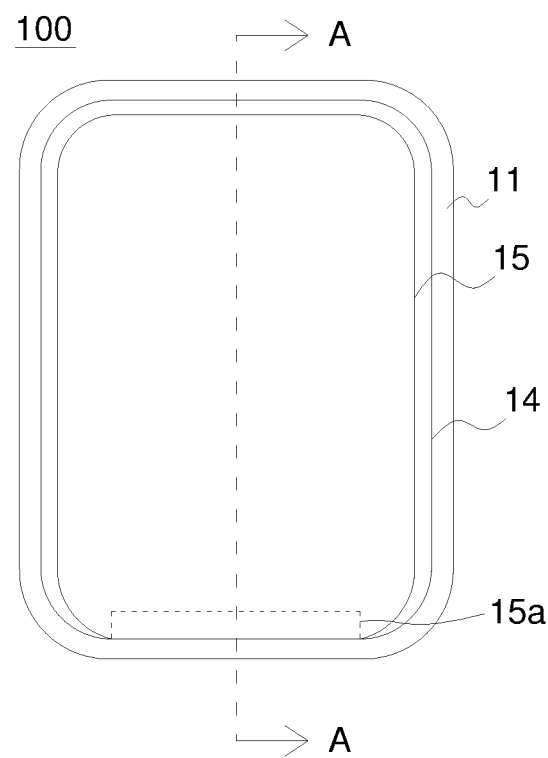
FIG. 2 is a schematic structural view of an OLED display panel in a first embodiment of the present application.
Figure 3:
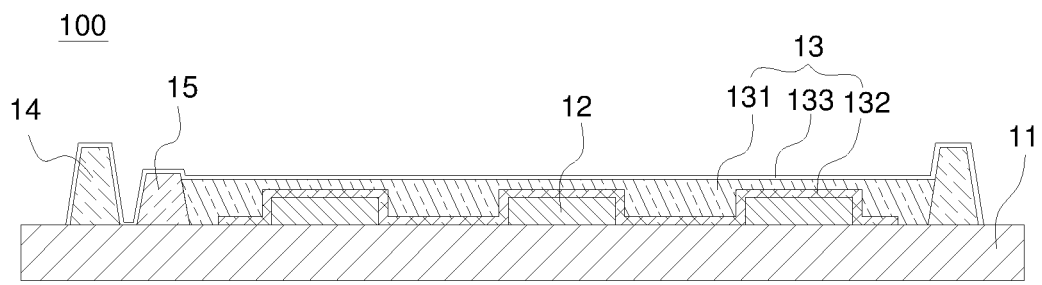
FIG. 3 is a schematic cross-sectional view of a line AA of FIG. 2.

Please refer to FIG. 2 and FIG. 3, FIG. 2 is a schematic structural view of an OLED display panel in a first embodiment of the present application, and FIG. 3 is a schematic cross-sectional view of a line AA of FIG. 2.

A narrow border OLED display panel 100 of the first embodiment of the present application includes a substrate 11, a light-emitting functional layer 12, an encapsulation layer 13, a first retaining wall 14, and a second retaining wall 15.

The light-emitting functional layer 12 is disposed on the substrate 11.

The encapsulation layer 13 is disposed on the light-emitting functional layer 12 which includes a first inorganic sub-layer 132, an organic sub-layer 131, and a second inorganic sub-layer 133 sequentially disposed on the light-emitting function layer 12.

The light-emitting functional layer 12 is disposed on the substrate 11. The encapsulation layer 13 is disposed on the light-emitting functional layer 12 and includes a first inorganic sub-layer 132, an organic sub-layer 131, and a second inorganic sub-layer 133 which are sequentially disposed on the light-emitting function layer 12. The first retaining wall 14 serves to prevent material of the organic sub-layer 131 from overflowing when the organic sub-layer 131 is formed, and is disposed around a peripheral side of the organic sub-layer 131 and is closely connected. The second retaining wall 15 serves to prevent the material of the organic sub-layer 131 from overflowing when the organic sub-layer 131 is formed and is disposed between the first retaining wall 14 and the organic sub-layer 131. The second retaining wall 15 is provided with at least one notch 15a to reduce a border width of a side of the OLED display panel 100 on which the notch is defined.

In the first embodiment, the notch 15a is defined on the second retaining wall 15, such that a portion of the second retaining wall 15 at the notch 15a does not exist, thereby saving the space for setting the wall, and further reducing a border width of a side of the OLED display panel 100 on which the notch 15a is defined.

The height of the first retaining wall 14 is greater than that of the second retaining wall 15. Such an arrangement can further prevent the material of the organic sub-layer 131 from overflowing when the organic sub-layer 131 is formed. Material of the first retaining wall 14 and the second retaining wall 15 may be transparent polyimide, and a spacing between the first retaining wall 14 and the second retaining wall 15 is between 10 micrometers and 100 micrometers.

In the first embodiment, the second retaining wall 15 includes two second side walls 15b disposed on two sides of the organic sub-layer 131 and a second sub-wall 15c connected to two ends of the two second side walls 15b. The notch 15a is defined and formed between the other two ends of the second side walls 15b. The first retaining wall 14 includes a first sub-wall 14a located close to the notch 15a. The second side walls 15b, the second sub-wall 15c, and the first sub-wall 14a are disposed around a circumferential periphery of the organic sub-layer 131.

Such an arrangement allows the organic sub-layer 131 on the notch 15a side has only one first retaining wall 14, the other sides of the organic sub-layer 131 are provided with a first retaining wall 14 and a second retaining wall 15, so that a border of the side of the OLED display panel 100 on which the notch 15a is defined is reduced.

In the first embodiment, the second side wall 15b is located on a gate driving side of the OLED display panel 100, the second sub-wall 15c is a second upper wall (i.e., the second sub-wall 15c is located on a source driving side of the OLED display panel 100), and the notch 15a is located at a lower border of the OLED display panel 100 thereby the width of the lower border of the OLED display panel is reduced. In addition, when the second sub-wall is a second lower wall (the second sub-wall is located on a fan-out area side of the OLED display panel), the notch is located on an upper border of the OLED display panel so that the width of the upper border of the OLED display panel can be reduced; when the second side wall is located on the source driving side of the OLED display panel, the notch is located on the gate driving side of the OLED display panel, so the border width (i.e., the side border width of both sides of the OLED display panel) of the gate driving side of the OLED display panel can be reduced. Therefore, in the present application, positions of the notch 15a, the second side wall 15b, and the second sub-wall 15c are not limited.

Figure 5:
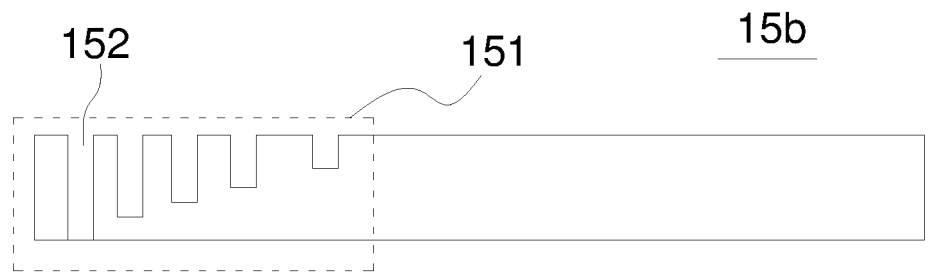
FIG. 5 is a schematic structural view of a second side wall of a second retaining wall of the OLED display panel in the first embodiment of the present application.

Please refer to FIG. 5. FIG. 5 is a schematic structural view of the second side wall of the second retaining wall according to the first embodiment of the OLED display panel of the present application. In the first embodiment, the second side wall 15b includes a flow guiding section 151 located close to the notch 15a for guiding the overflowed organic material to flow between the first retaining wall 14 and the second retaining wall 15, and a plurality of flow guiding channels 152 each having a capillary function are defined in the flow guiding section 151.

Figure 4:
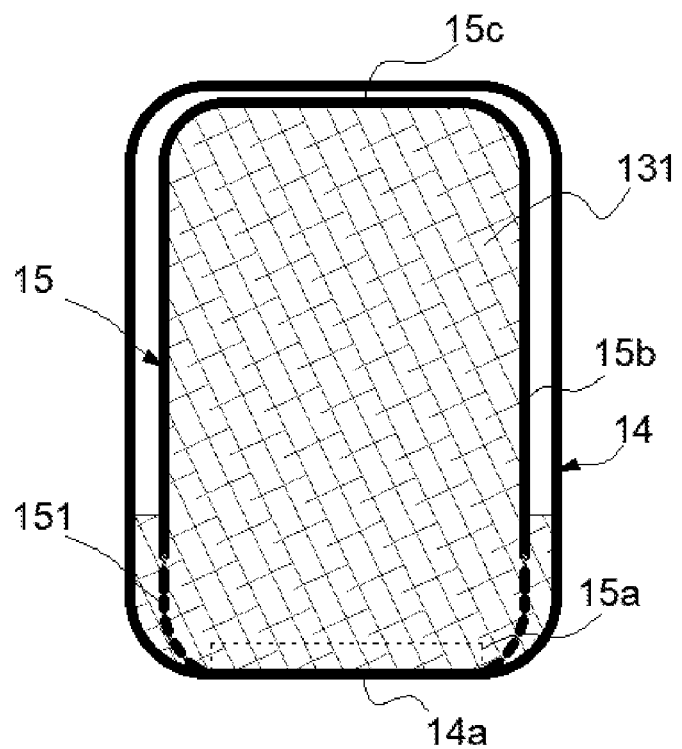
FIG. 4 is a schematic diagram of an overflow structure of the OLED display panel in the first embodiment of the present application, due to a capillary phenomenon.

The flow guiding channel 152 further prevents the material of the organic sub-layer 131 from overflowing because when a liquid material of the organic sub-layer 131 is overfilled (i.e., the appearance of the material forms a convex surface), the flow guiding channel 152 guides the overfilled liquid material to flow between the first retaining wall 14 and the second retaining wall 15 by the capillary function. Thereby the overflow of the material of the organic sub-layer 131 is avoided, as shown in FIG. 4.

In the first embodiment, the width of the flow guiding channel 152 is less than 1 mm, optionally, the width of the flow guiding channel 152 is greater than 50 microns. When the width of the flow guiding channel 152 is smaller, the phenomenon that the guiding channel 152 attracts the liquid material is more obvious, that is, the farther the distance between the flow guiding channel 152 and the liquid material is, the faster the guiding flow is. Therefore, in order to ensure that the flow guiding channel 152 can introduce the liquid material of the organic sub-layer 131 to flow between the first retaining wall 14 and the second retaining wall 15, the width of the flow guiding channel 152 is less than 1 mm.

Optionally, in order to ensure the flow guiding channel 152 has enough guiding distance and sufficient guiding efficiency, the width of the guiding channel 152 is greater than or equal to 100 micrometers and less than or equal to 700 micrometers.

In the first embodiment, the flow guiding channel 152 is a guiding groove 152, and a depth of the guiding groove 152 is less than or equal to a height of the second side wall 15b.

Optionally, in order to ensure that the flow guiding channel 152 has enough guiding distance and sufficient guiding efficiency, the width of the guiding channel 152 is greater than or equal to 100 micrometers and less than or equal to 700 micrometers.

In the first embodiment, the flow guiding channel 152 is the guiding groove 152, and a depth of the guiding groove 152 is less than or equal to a height of the second side wall 15b.

The depth of the guide groove 152 gradually becomes shallower from an end close to the notch 15a toward an end away from the notch 15a. Such an arrangement allows the liquid material of the organic sub-layer 131 close to the first sub-wall 14a to be quickly introduced to flow between the first retaining wall 14 and the second retaining wall 15, improving the strength and efficiency of the protection.

Further, a spacing between two adjacent flow guiding grooves 152 gradually increases from an end close to the notch 15a toward an end away from the notch 15a. Such an arrangement allows the liquid material of the organic sub-layer 131 close to the first sub-wall 14a to be quickly introduced to flow between the first retaining wall 14 and the second retaining wall 15, improving the strength and efficiency of the protection.

In the first embodiment, when the liquid material of the organic sub-layer 131 is overfilled, a top surface of the liquid material is higher than the height of the second retaining wall 15. Therefore, the liquid material generates pressure, and under the capillary function of the guide groove 152, the liquid material is introduced into the guide groove 152 and enters between the first retaining wall 14 and the second retaining wall 15. Thereby, the overflow of the organic liquid material of the organic sub-layer 131 is avoided.

Figure 6:
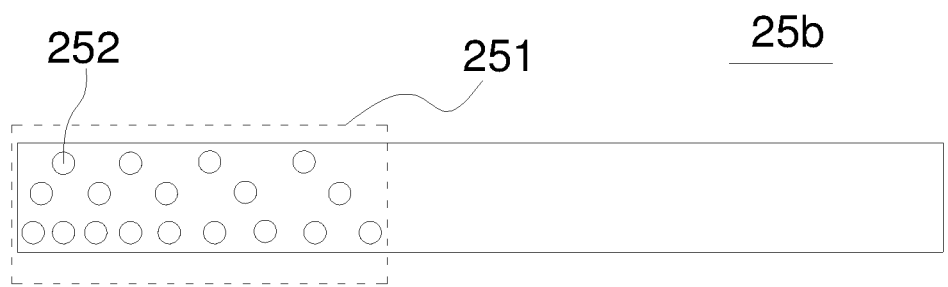
FIG. 6 is a schematic structural view of a second side wall of a second retaining wall of an OLED display panel in a second embodiment of the present application.

Please refer to FIG. 6, FIG. 6 is a schematic structural view of a second side wall of a second retaining wall of the OLED display panel according to the second embodiment of the present application. In the second embodiment, the difference between this embodiment and the first embodiment is that in the flow guiding section 251, the flow guiding channel 252 is a flow guiding hole 252, and the density of the flow guiding holes 252 gradually decreases from an end close to the notch toward an end away from the notch. Such an arrangement allows the liquid material of the organic sub-layer close to the first sub-wall to be quickly introduced to flow between the first retaining wall and the second retaining wall, improving the strength and efficiency of the protection.

In addition, the density of the flow guiding holes 252 gradually increases from a top end of the second side wall 25b to a bottom end of the second side wall 25b. Since in the organic sub-layer, the lower portion of the organic liquid material is subjected to greater pressure, a plurality of denser flow guiding holes 252 are provided at the bottom end of the first side wall 25b to increase the efficiency of the organic liquid material flow to the first retaining wall and the second retaining wall, thereby improving the ability to prevent the material of the organic sub-layer from overflowing.

In the second embodiment, the flow guiding holes 252 are arranged in an array, and the flow guiding holes 252 between adjacent rows are arranged in a staggered manner. Such an arrangement makes the flow guiding holes 252 in the second side wall 25b more uniform, and improves the stability and the strength uniformity of the second side wall 25b.

It should be noted that an aperture of the flow guiding holes 252 in the second embodiment is equal to the width of the flow guiding channel in the first embodiment.

Figure 7:
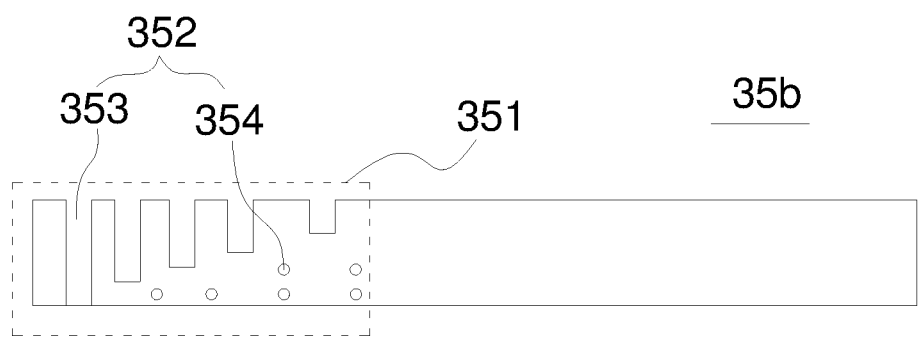
FIG. 7 is a schematic structural view of a second side wall of a second retaining wall of an OLED display panel in a third embodiment of the present application.

In the third embodiment, please refer to FIG. 7. FIG. 7 is a schematic structural view of a second side wall of a second retaining wall of the OLED display panel in the third embodiment of the present application. The difference between this embodiment and the first embodiment is that in a flow guiding section 351, a flow guiding channel 352 includes a guiding groove 353 and a guiding hole 354, and a depth of the guiding groove 353 is less than or equal to a height of a second side wall 35b.

In the third embodiment, a flow guiding hole 354 is located below the guiding groove 353 and is provided in a staggered manner with the guiding groove 353. The depth of the guiding groove 353 gradually becomes shallower from an end close to the notch toward an end away from the notch.

Since the opening area of the flow guiding hole 354 on the second side wall 35b is smaller than the opening area of the guiding groove 353 in the second side wall 35b, the flow guiding hole 354 is disposed below the flow guiding groove 353 to improve the stability of the second side wall 35b. The dislocation of the flow guiding hole 354 and the guiding groove 353 increases the uniformity of the strength of the second side wall 35b. The depth of the guide groove 353 is gradually shallower from the end close to the notch to the end away from the notch, such that the liquid material of the organic sub-layer close to the first sub-wall is quickly introduced to flow between the first retaining wall and the second retaining wall, thereby improving the strength and efficiency of the protection.

Figure 8:
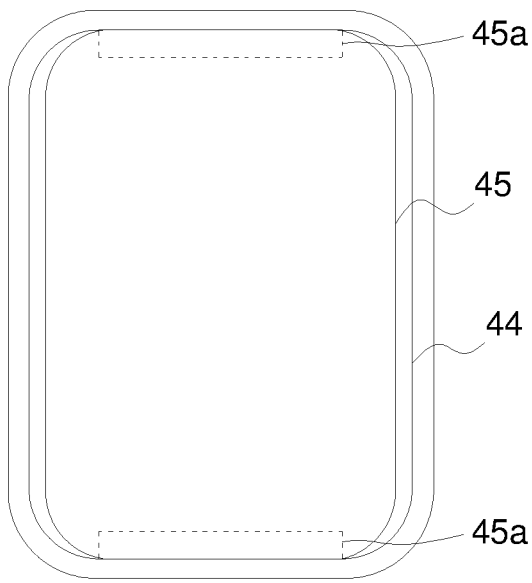
FIG. 8 is a schematic structural view of an OLED display panel in a fourth embodiment of the present application.
Figure 9:
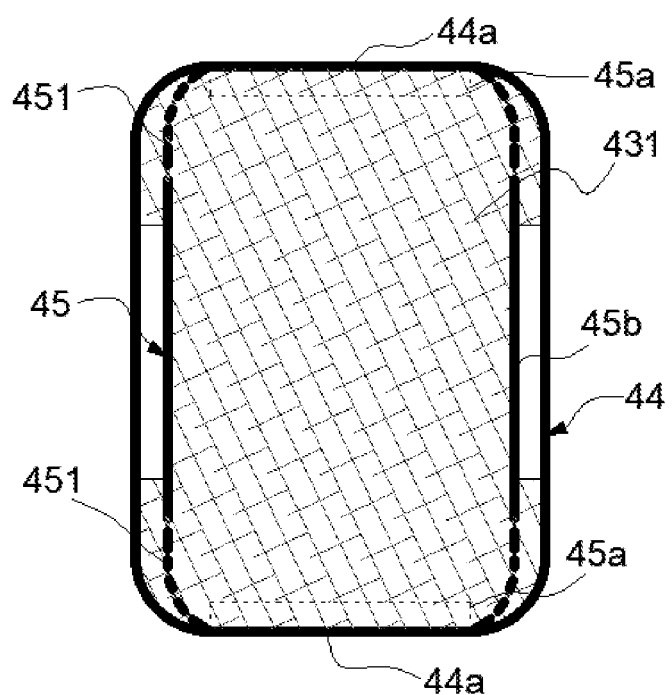
FIG. 9 is a schematic diagram of an overflow structure of the OLED display panel in the fourth embodiment of the present application, due to a capillary phenomenon.

In the fourth embodiment, please refer to FIG. 8 and FIG. 9. FIG. 8 is a schematic structural view of an OLED display panel in the fourth embodiment of the present application. FIG. 9 is a schematic diagram of an overflow structure of the OLED display panel in the fourth embodiment of the present application, due to a capillary phenomenon.

The difference between the fourth embodiment and the first embodiment to the third embodiment is in that the second retaining wall 45 includes two second side walls 45b disposed on both sides of an organic sub-layer 431. A notch 45a is defined between both ends of the second side wall 45b. A first retaining wall 44 includes two first sub-walls 44a close to the corresponding the notch 45a. The two second side walls 45b and the two first sub-walls 44a are disposed around a peripheral side of the organic sub-layer 431.

Since the second retaining wall 45 has two oppositely disposed notches 45a, such that the border width of a side of the OLED display panel on which the notch 45a is defined is reduced.

In the fourth embodiment, the notch 45a is located close to the upper and lower borders of the OLED display panel 400, so that the widths of the upper and lower borders of the OLED display panel 400 are reduced.

Since the second retaining wall 45 has two notches 45a, both ends of the second side wall 45b include a flow guiding section 451, and each of the flow guiding sections 451 is provided with a flow guiding channel 452 having a capillary function.

Figure 10:
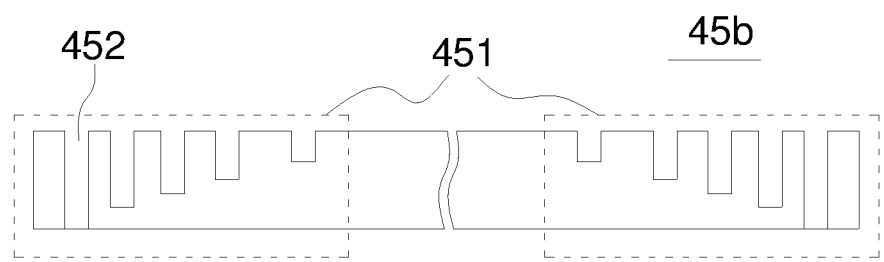
FIG. 10 is a schematic structural view of a second side wall of a second retaining wall of the OLED display panel in the fourth embodiment of the present application.

Please refer to FIG. 10, FIG. 10 is a schematic structural view of a second side wall of a second retaining wall of the OLED display panel in the fourth embodiment of the present application. The structure of the flow guiding channel 452 of the flow guiding section 451 in the second side wall 45b of the second retaining wall 45 in the fourth embodiment is the same as the structure of the flow guiding channel 452 of the first embodiment.

For the specific structure of the flow guiding channel 452, please refer to the first embodiment, and details are not described herein.

Of course, the structure of the flow guiding channel 452 in the fourth embodiment may also be the flow guiding channel of the second embodiment or the flow guiding channel of the third embodiment. Please refer to the second embodiment and the third embodiment for details.

Compared to the prior-art OLED display panel, the narrow border OLED display panel of the present application has a notch formed on the second retaining wall, such that there is no walls at the site where the notch is defined, thus saving the width of one wall, further reducing the border width of a side of the OLED display panel on which the notch is defined; the technical problem that the prior-art OLED display panel has a wide border is solved.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A narrow border organic light-emitting diode (OLED) display panel, comprising:
   a substrate;
   a light-emitting functional layer disposed on the substrate;
   an encapsulation layer disposed on the light-emitting functional layer and comprising an organic sub-layer;
   a first retaining wall for preventing an overflow of material for forming the organic sub-layer when the organic sub-layer is formed, the first retaining wall being disposed around a circumferential periphery of the organic sub-layer; and
   a second retaining wall for preventing the overflow of the material for forming the organic sub-layer when the organic sub-layer is formed, the second retaining wall being disposed between the first retaining wall and the organic sub-layer;
   wherein the second retaining wall is provided with at least a notch to reduce a border width of a side of the OLED display panel on which the notch is defined;
   the second retaining wall comprising two second side walls disposed on two sides of the organic sub-layer and a second sub-wall connected to two ends of the two second side walls, the notch being defined and formed between the other two ends of the second side walls;
   the first retaining wall comprising a first sub-wall located close to the notch;
   the second side walls, the second sub-wall, and the first sub-wall being disposed around the circumferential periphery of the organic sub-layer;
   the second side wall comprising a flow guiding section located close to the notch for guiding the overflowed organic material to flow between the first retaining wall and the second retaining wall, and a plurality of flow guiding channels each having a capillary function being defined in the flow guiding section.

2. The narrow border OLED display panel according to claim 1, wherein each of the flow guiding channels is a flow guiding groove, and a depth of the flow guiding groove is less than or equal to a height of the second side wall.

3. The narrow border OLED display panel according to claim 2, wherein a depth of the flow guiding groove gradually becomes shallower from an end close to the notch toward an end away from the notch.

4. The narrow border OLED display panel according to claim 2, wherein a spacing between two adjacent flow guiding grooves gradually increases from the end close to the notch toward the end away from the notch.

5. The narrow border OLED display panel according to claim 1, wherein each of the flow guiding channels is a flow guiding hole.

6. The narrow border OLED display panel according to claim 5, wherein the density of the flow guiding holes gradually decreases from an end close to the notch toward an end away from the notch.

7. The narrow border OLED display panel according to claim 5, wherein the density of the flow guiding holes gradually increases from a top end of the second side wall to a bottom end of the second side wall.

8. The narrow border OLED display panel according to claim 1, wherein the flow guiding channels comprise flow guiding grooves and flow guiding holes, and a depth of each of the guiding grooves is less than or equal to a height of the second side walls.

9. A narrow border organic light-emitting diode (OLED) display panel, comprising:
   a substrate;
   a light-emitting functional layer disposed on the substrate;
   an encapsulation layer disposed on the light-emitting functional layer and comprising an organic sub-layer;
   a first retaining wall for preventing an overflow of a material for forming the organic sub-layer when the organic sub-layer is formed, the first retaining wall being disposed around a circumferential periphery of the organic sub-layer; and
   a second retaining wall for preventing the overflow of the material for forming the organic sub-layer when the organic sub-layer is formed, the second retaining wall being disposed between the first retaining wall and the organic sub-layer;
   wherein the second retaining wall is provided with at least a notch to reduce a border width of a side of the OLED display panel on which the notch is defined.

10. The narrow border OLED display panel according to claim 9, wherein the second retaining wall comprises the two second side walls disposed on the two sides of the organic sub-layer, the notch is defined and formed between two ends of the second side wall; the first retaining wall comprises two first sub-walls close to the corresponding notch; the two second side walls and the two first sub-walls are disposed around a peripheral side of the organic sub-layer.

11. The narrow border OLED display panel according to claim 10, wherein the second side wall comprises a flow guiding section located close to the notch for guiding the overflowed organic material to flow between the first retaining wall and the second retaining wall, and a plurality of flow guiding channels each having a capillary function being defined in the flow guiding section.

12. The narrow border OLED display panel according to claim 11, wherein each of the flow guiding channels is a flow guiding groove, and a depth of the flow guiding groove is less than or equal to a height of the second side wall.

13. The narrow border OLED display panel according to claim 11, wherein the flow guiding channels comprise flow guiding grooves and the flow guiding holes, and a depth of each of the guiding grooves is less than or equal to a height of the second side walls.

14. The narrow border OLED display panel according to claim 13, wherein the flow guiding hole is located below the guiding groove and is provided in a staggered manner with the guiding groove, a depth of the guiding groove gradually becomes shallower from the end close to the notch toward the end away from the notch.

15. The narrow border OLED display panel according to claim 12, wherein a depth of the flow guiding groove gradually becomes shallower from an end close to the notch toward an end away from the notch.

16. The narrow border OLED display panel according to claim 12, wherein a spacing between two adjacent guiding channels gradually increases from the end close to the notch toward the end away from the notch.

17. The narrow border OLED display panel according to claim 11, wherein each of the flow guiding channels is a flow guiding hole.

18. The narrow border OLED display panel according to claim 17, wherein the density of the flow guiding holes gradually decreases from the end close to the notch toward the end away from the notch.

19. The narrow border OLED display panel according to claim 17, wherein the density of the flow guiding holes gradually increases from a top end of the second side wall to a bottom end of the second side wall.

20. The narrow border OLED display panel according to claim 9, wherein the second retaining wall comprises two second side walls disposed on two sides of the organic sub-layer and a second sub-wall connected to two ends of the two second side walls, the notch being defined and formed between the other two ends of the second side walls; the first retaining wall comprises a first sub-wall located close to the notch; the second side walls, the second sub-wall, and the first sub-wall being disposed around the circumferential periphery of the organic sub-layer.

* * * * *